United States Patent
Chiesl (12)

(10) Patent No.: US 6,582,568 B1
(45) Date of Patent: Jun. 24, 2003

(54) FIRST STAGE SALICIDATION OF COBALT DURING COBALT DEPOSITION OR SUBSEQUENT TI OR TIN CAP DEPOSITION USING ENERGY FROM A DIRECTIONAL PLASMA

(75) Inventor: Newell E. Chiesl, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/999,872

(22) Filed: Oct. 19, 2001

(51) Int. Cl.[7] .............................................. C23K 14/34
(52) U.S. Cl. ........................ 204/192.15; 204/192.12; 204/298.06; 204/298.11
(58) Field of Search ................ 204/192.12, 192.15, 204/192.23, 298.06, 298.11, 298.13

(56) References Cited

U.S. PATENT DOCUMENTS

| | | | | | |
|---|---|---|---|---|---|
| 5,707,498 A | * | 1/1998 | Ngan | ..................... | 204/192.12 |
| 6,254,739 B1 | * | 7/2001 | Fan | ......................... | 204/192.15 |
| 6,277,253 B1 | * | 8/2001 | Narasimhan et al. | .. | 204/298.06 |

* cited by examiner

Primary Examiner—Steven H. Versteeg
(74) Attorney, Agent, or Firm—Christopher P. Maiorana, P.C.

(57) ABSTRACT

The present invention concerns an apparatus comprising a fixture and a sputtering device. The fixture may be configured to position a semiconductor wafer in a plasma. The sputtering device may be configured to sputter metal atoms onto a surface of the wafer in a direction perpendicular to the surface.

20 Claims, 2 Drawing Sheets

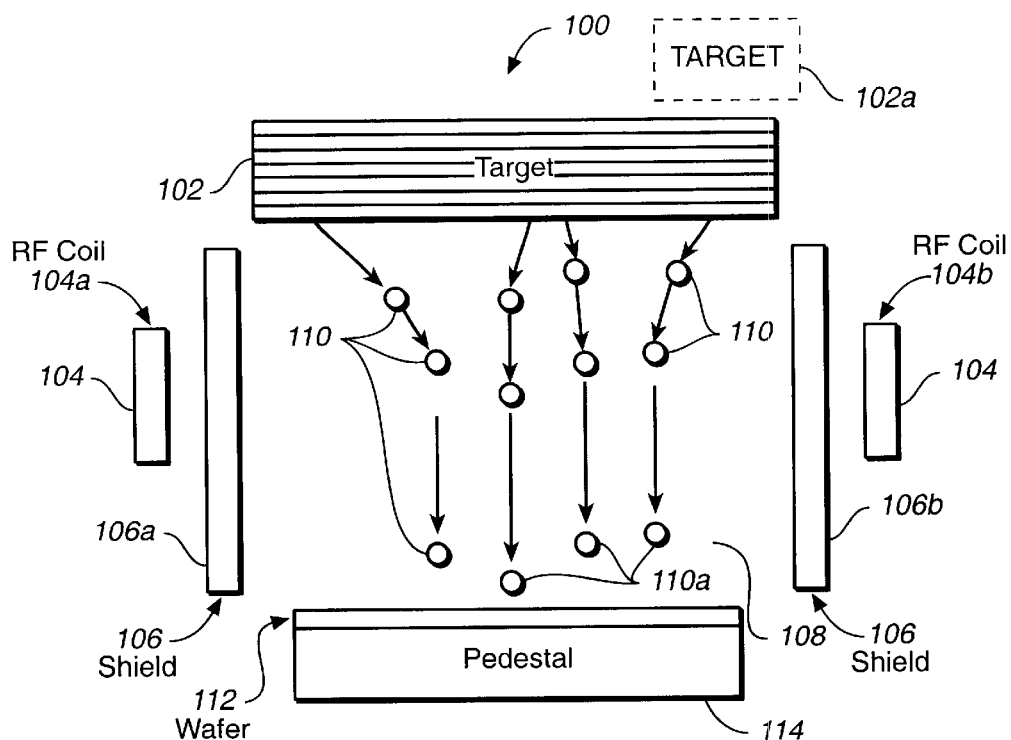
FIG._1
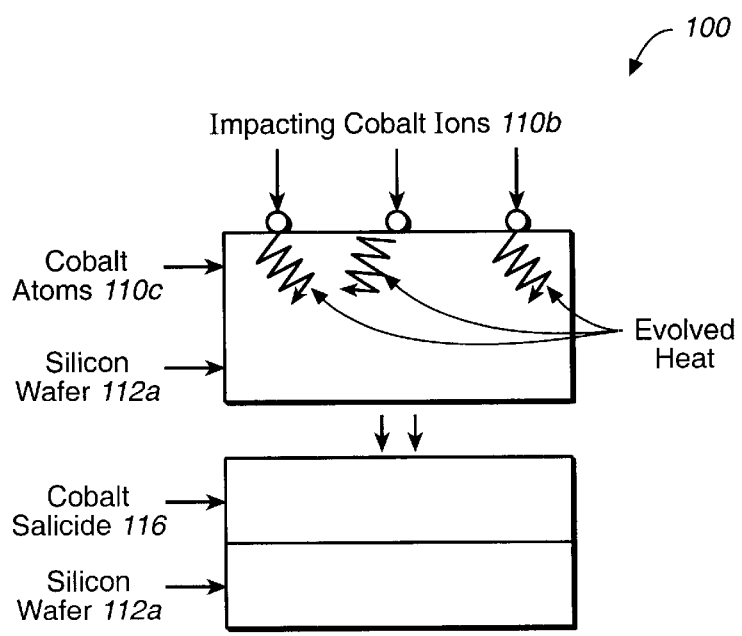
FIG._2

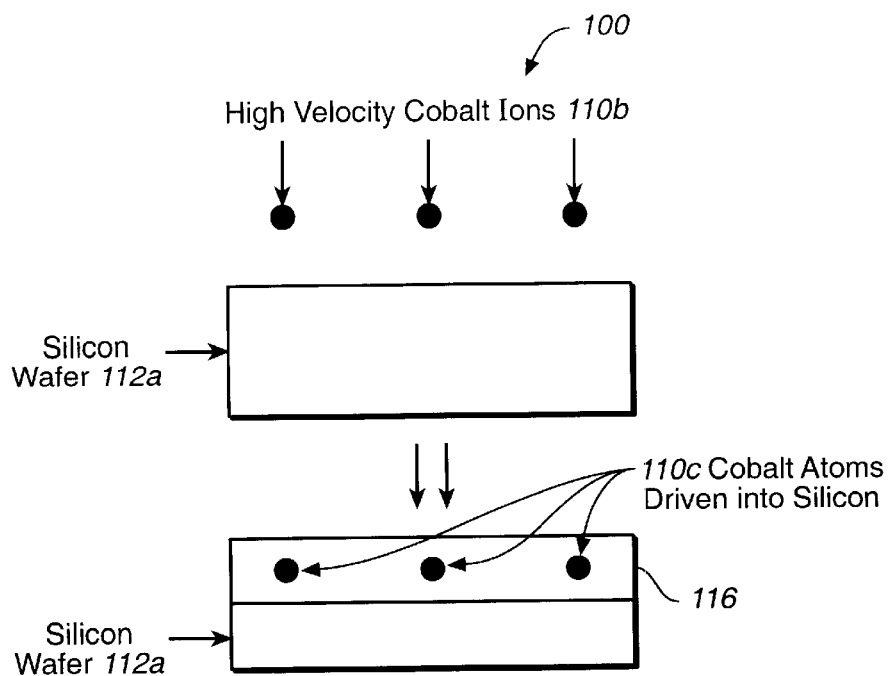
FIG._3
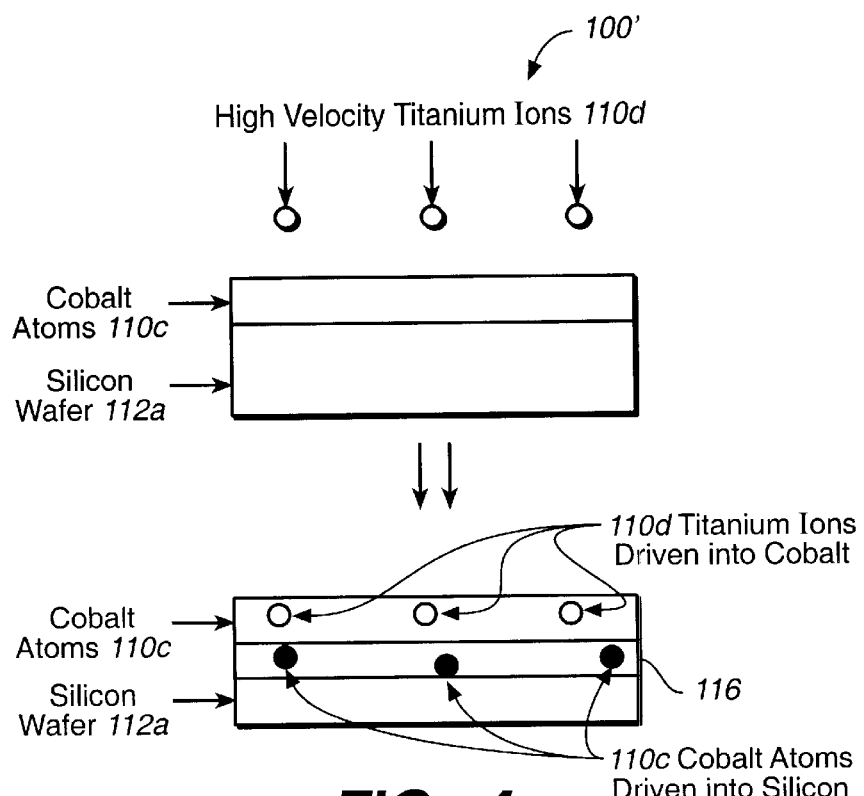
FIG._4

FIRST STAGE SALICIDATION OF COBALT DURING COBALT DEPOSITION OR SUBSEQUENT TI OR TIN CAP DEPOSITION USING ENERGY FROM A DIRECTIONAL PLASMA

FIELD OF THE INVENTION

The present invention relates to a method and/or architecture for implementing semiconductors generally and, more particularly, to a method and/or architecture for salicidation of cobalt on a semiconductor wafer.

BACKGROUND OF THE INVENTION

The conventional method of forming cobalt salicide (i.e., self aligned silicide) on a surface of a silicon semiconductor wafer is via the following steps: (i) depositing cobalt on the surface of the wafer using a conventional (i.e., non-directional) DC sputtering system, (ii) depositing either a titanium or titanium/titanium nitride cap over the cobalt layer using the conventional DC sputtering system to getter up oxygen, (iii) reacting the cobalt with the underlying active silicon regions using a first stage rapid thermal process in a temperature range from 400° C. to 550° C., (iv) chemically stripping the cobalt that was not over silicon and thus not reacted, (v) converting the cobalt silicon compound formed in the first rapid thermal process (i.e., step (iii)) to a fully reacted and converted cobalt salicide using a second rapid thermal process at a temperature range from 700° C. to 1000° C. The conventional process has many steps and each step (i) costs money, (ii) adds to the cycle time, and (iii) can create scrap when not performed properly.

It would be desirable to have a method and/or architecture for salicidation of a cobalt layer on a semiconductor wafer that (i) implements fewer steps than the conventional method, (ii) reduces costs, and/or (iii) reduces cycle time.

SUMMARY OF THE INVENTION

The present invention concerns an apparatus comprising a fixture and a sputtering device. The fixture may be configured to position a semiconductor wafer in a plasma. The sputtering device may be configured to sputter metal atoms onto a surface of the wafer in a direction perpendicular to the surface.

The objects, features and advantages of the present invention include providing a method and/or architecture for forming a cobalt salicide on a surface of a semiconductor wafer that may: (i) eliminate a step in the salicidation process, (ii) reduce production cost, (iii) reduce process cycle time, (iv) minimize wafer damage, (v) provide a uniform distribution of metal ions in the wafer, and/or (vi) increase the accuracy of cobalt distribution within the wafer.

BRIEF DESCRIPTION OF THE DRAWINGS

These and other objects, features and advantages of the present invention will be apparent from the following detailed description and the appended claims and drawings in which:

FIG. 1 is a block diagram of a preferred embodiment of the present invention;

FIG. 2 is a block diagram illustrating an operation of the present invention;

FIG. 3 is a block diagram illustrating an alternate operation of the present invention; and FIG. 4 is a block diagram illustrating another alternate operation of the present invention.

DETAILED DESCRIPTION OF THE PREFERRED EMBODIMENTS

Referring to FIG. 1, a block diagram illustrating a system 100 is shown in accordance with a preferred embodiment of the present invention. The system 100 may be implemented as a directionalized sputtering system. The system 100 may comprise a target 102, one or more RF coils 104 (e.g., RF coils 104a and 104b), one or more shields 106 (e.g., shields 106a and 106b), a plasma field 108, a wafer 112, and a pedestal 114.

The target 102 may be a source of atoms 110. In one example, the target 102 (and the atoms 110) may comprise cobalt. In another example the target 102 may be implemented as Hf, Mo, Ni, Pd, Pt, Ta, W, Zr, Cr, etc. In yet another example (e.g., when forming a cap over a cobalt layer), the atoms 110 may comprise titanium (Ti), or titanium/titanium nitride (Ti/TiN). However, any appropriate metal, material or metal compounds may be implemented accordingly to meet the design criteria of a particular application. The system 100 may be configured to first implement the target 102 using cobalt and then implement another target 102a using an alternative metal, material or compound (e.g., titanium, titanium/nitride) to form one or more layers on the same wafer 112. The alternative metal, material or compound may form a cap over the cobalt.

The RF coils 104 may be implemented as a pair of coils (e.g., the coils 104a and 104b) positioned on either side of the plasma field 108. The RF coils 104 may be configured to generate an electromagnetic field across the plasma 108. In one example, the RF coils 104a and 104b may be positioned on opposing sides of the plasma 108. However, any appropriate number of RF coils 104 and appropriate positioning may be implemented accordingly to meet the design criteria of a particular application. The shields 106 may be implemented as a heat resistant material that will not interfere with the electromagnetic field generated via the RF coils 104. The shields 106 may be positioned to separate the plasma field 108 from the RF coils 104. The shields 106 may be configured to protect the RF coils 104 from heat generated in the plasma 108.

Examples of sputtering deposition systems that implement RF coils include the Applied Material "Ion Metal Plasma" system and the Novellus "Hollow Cathode Magnetron" system. However, any appropriate sputtering system may be implemented accordingly to meet the design criteria of a particular application. The electromagnetic field generated via the RF coils 104 may be configured to control ionization of the atoms 110 in the plasma 108. The electromagnetic field generated via the coils 104 may positively ionize the atoms 110 (e.g., ionized atoms 110a). The electromagnetic field generated via the coils 104 may be configured to control the location that ionized atoms 110a are deposited on a surface of the wafer 112 that is exposed to the plasma 108.

The electromagnetic field generated via the coils 104 may suspend the ionized atoms 110a in the plasma field 108. The length of time that the ionized atoms 110a are suspended in the plasma field 108 may control the ratio of ionized atoms 110a to non-ionized atoms 110. The atoms 110 may randomly sputter off the target 102. The atoms 110 may disperse upon entering the plasma field 108 due to the random sputtering from the target 102. The electromagnetic field generated via the RF coils 104 may be configured to align the ionized atoms 110a to form concentrated directional (e.g., perpendicular) deposition of the ionized atoms 110a on the surface of the wafer 112 exposed to the plasma 108.

The plasma field 108 may comprise a stream of gas. The plasma field 108 may comprise an inert gas and/or an inert gas mixture (not shown). In one example, the inert gas may be implemented as argon. However, any appropriate inert gas and/or gasses may be implemented accordingly to meet the design criteria of a particular application. The plasma field 108 may generate heat that may be sufficient to ionize some of the gas atoms that comprise the plasma 108. The ionized gas atoms may impact the target 102 and cause the atoms 110 to be sputtered off the target 102. The atoms 110 may migrate from the target 102 and into the plasma field 108.

The wafer 112 may be implemented in silicon. In other examples, the wafer 112 may be implemented in gallium arsenide, germanium, gallium nitride, aluminum phosphide, diamond, $Si_{1-x}Ge_x$, and/or $Al_xGa_{1-x}As$, where $0 \leq x \leq 1$. However, any appropriate semiconductor wafer material may be implemented accordingly to meet the design criteria of a particular application. The pedestal 114 may be implemented as an electrically conductive material.

The wafer 112 may be positioned on the pedestal 114 in line with and below the plasma field 108. In one example, a DC current (not shown) may be coupled to the pedestal 114. The DC current may be configured to generate a negative electrical potential across the wafer 112. The positively charged ions 110a may be accelerated out of the plasma field 108 and toward the wafer 112 in response to the negative electrical potential across the wafer 112.

In another example, the velocity of ionized atoms 110a may be controlled in response to vapor pressure of the plasma 108 in the system 100. Increased vapor pressure of the plasma 108 generally increases the density of the plasma 108. The increased density of the plasma 108 may increase the number of collisions of the ionized atoms 110a and the plasma 108. The increased density of the plasma 108 may reduce the velocity of the ionized atoms 110a moving towards the wafer 112. The increased velocity of the ionized atoms 110a in response to (i) the electromagnetic field generated via the coils 104 and/or (ii) the electrical potential across the wafer 112 may forcefully drive the ionized atoms 110a into the wafer 112. The velocity of the ionized atoms 110a is generally a function of the DC potential applied across the wafer 112 and/or the vapor pressure in the system 100.

Using the directionalized sputtering of the system 100, cobalt (e.g., the atoms 110) may be reacted and/or mixed with the underlying wafer 112 (e.g., silicon atoms) via one or more of the following phenomena:

(i) The cobalt may react with the wafer 112 in response to the elevated temperature of the surface of the wafer 112 generated in response to the incidental energy from the directional (e.g., perpendicular) deposition of the cobalt and/or the subsequent Ti (or Ti/TiN) (described in connection with FIGS. 2 and 4).

(ii) The high velocity of the cobalt generated via the directionalized (e.g., perpendicular) sputtering of the cobalt may cause the cobalt to be physically driven into the wafer 112 without the surface of the wafer 112 attaining a temperature sufficient to react with the cobalt (described in connection with FIG. 3).

(iii) The directionalized (e.g., perpendicular) sputtering of a Ti (or Ti/TiN) cap on the wafer 112 may cause the Ti (or Ti/TiN) to impact the underlying cobalt with sufficient velocity to cause the cobalt to be physically driven into the wafer 112 when the temperature of the wafer 112 is not sufficiently high to generate a reaction between the cobalt and the wafer 112 (described in connection with FIG. 4).

(iv) The perpendicular sputtering of the cobalt or subsequent titanium (or titanium nitride) cap at a system 100 temperature in range of 400° C. to 500° C. (in contrast to the conventional deposition which is conducted at a system temperature of less than 350° C.) may cause the cobalt to react with the wafer 112.

Referring to FIG. 2, a block diagram illustrating an operation of the directional sputtering system 100 is shown. A silicon wafer 112a may comprise a salicide layer 116. When cobalt ions 110b impact the silicon wafer 112a, evolved heat (e.g., thermic energy) may be released. The velocity of the cobalt ions 110b and an incidence angle of the cobalt ions 110b to the surface of the silicon wafer 112a generally determines the amount of incidental thermic energy that will be transferred from the cobalt ions 110b to the silicon wafer 112a. The incidence angle and velocity of the cobalt ions 110b may be factors in determining the surface temperature of the silicon wafer 112a.

To provide maximum energy transfer from the cobalt ions 110b to the silicon wafer 112a, the cobalt ions 110b generally impact the silicon wafer 112a at an angle perpendicular to the surface of the silicon wafer 112a. The evolved heat may raise the surface temperature of the silicon wafer 112a. The elevated silicon wafer 112a surface temperature may cause the cobalt ions 110b to penetrate and mix into (e.g., react with) the silicon wafer 112a. The reaction of the cobalt and the silicon wafer 112a may form the layer of cobalt salicide 116. The layer of cobalt salicide 116 may be formed on the surface of the silicon wafer 112a exposed to the plasma 108.

Referring to FIG. 3, a block diagram illustrating another operation of the system 100 is shown. The system 100 may be configured to provide sufficient kinetic energy to the cobalt ions 110b such that the cobalt ions 110b are driven into the silicon wafer 112a.

The cobalt may be ionized via the coils 104. After ionization and alignment (e.g., perpendicular to the surface of the wafer 112) via the coils 104, the cobalt ions 110b may gain velocity as the DC potential across the silicon wafer 112a causes the cobalt ions 110b to migrate out of the plasma field 108. The acceleration of the cobalt ions 110b toward the silicon wafer 112a may provide the cobalt ions 110b with kinetic energy. The cobalt ions 110b may have sufficient kinetic energy to enter the interstitial spaces between the silicon atoms of the silicon wafer 112a upon impact. The cobalt ions 110b may mix with the silicon wafer 112a atoms. The cobalt salicide layer 116 may be formed as cobalt atoms 110c become mixed with the silicon atoms. The force driven process of generating the cobalt salicide layer 116 may be accomplished without the silicon wafer 112a surface elevated to a temperature sufficient to cause a reaction of the cobalt atoms 110c with the silicon wafer 112a (e.g., the temperature of the surface of the silicon wafer 112a may be less than 250° C.). However, the temperature of the surface of the silicon wafer 112a sufficient for a reaction of the cobalt atoms 110c with the silicon wafer 112a may also depend on factors such as the plasma gas 108 composition, vapor pressure of the plasma 108, the amount of power supplied to the system 110, cooling of the pedestal 114, the size of the chamber that contains the system 100, etc. The temperature of the surface of the silicon wafer 112a sufficient for the reaction of the cobalt atoms 110c with the silicon wafer 112a may be greater or less than 250° C. (e.g., a range of 100° C. to 700° C.).

Referring to FIG. 4, a block diagram 100' illustrating an alternate operation of the system 110 is shown. The system 100' may comprise titanium (or titanium nitride) ions 110d (e.g., the target 102a may comprise Ti and/or Ti/TiN). The system 100 may be configured to directionally (e.g., perpendicularly) sputter the Ti ions 110d over the cobalt atoms 110c to form a cap.

The layer of cobalt atoms 110c may first be deposited on the surface of the silicon wafer 112a. In one example, the layer of cobalt atoms 110c may be deposited on the surface of the silicon wafer 112a that is exposed to the plasma 108 using the directionalized sputtering system 100. However, any appropriate cobalt deposition apparatus and/or process may be implemented accordingly to meet the design criteria of a particular application.

When the layer of cobalt atoms 110c has been deposited on the silicon wafer 112a, the titanium (or Ti/TiN) ions 110d may be deposited over the layer of cobalt atoms 110c. The Ti (or Ti/TiN) ions 110d may be deposited over the cobalt atoms 110c using the system 100 similarly to the deposition of the atoms 110 described in connection with FIGS. 1–3. The titanum ions 110d may impact the layer of cobalt atoms 110c with sufficient velocity to transfer kinetic energy from the titanium ions 110d to the cobalt atoms 110c. The transfer of kinetic energy to the cobalt atoms 110c may cause the cobalt atoms 110c located in the cobalt layer to (i) react with the silicon wafer 112a and/or (ii) forcefully penetrate the silicon wafer 112a. The cobalt atoms 110c and silicon may form a salicide layer 116 via the processes described in connection with FIGS. 1–3.

The present invention may be configured to react and/or mix the cobalt and underlying silicon during the cobalt and/or subsequent titanium or titanium/titanium nitride deposition steps. The present invention may eliminate a first rapid thermal process and reduce salicidation process costs.

In one example, the present invention may comprise performing the deposition of the cobalt (or a subsequent titanium or titanium nitride cap) to the silicon wafer 112a at a system 100 temperature in a range of 400° C. to 500° C. Conventional cobalt deposition systems operate at temperatures of less than 350° C. The higher operating temperature of the system 100 may provide for a better yield of cobalt salicide due to the elevated surface temperature of the silicon wafer 112a. The present invention may reduce scrap.

The present invention may eliminate the first rapid thermal annealing step in the salicidation process by implementing an architecture and/or method that provides the energy required to react the cobalt and the silicon during the deposition of the cobalt and/or during the deposition of the titanium (or titanium nitride) cap. The energy for the reaction and/or mixing of the ions 110a with the wafer 112 may be supplied by the directionalized sputtering system 100. The energy for the reaction and/or mixing of the cobalt with the silicon may be transferred to the silicon wafer 112a as either thermal or kinetic energy.

After the directionalized sputtering step described above has been performed, the system 100 may implement the steps of:

(i) implementing a chemical strip to remove unreacted cobalt; and (ii) implementing a second rapid thermal process in the range of 700° C. to 1000° C. to fully convert the cobalt silicon compound formed in the directionalized sputtering process to a fully reacted and converted cobalt salicide.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a fixture configured to position a wafer adjacent a plasma;

a first target comprising a metal;

a second target comprising a first material; and a sputtering device adapted to (i) sputter said metal from said first target onto a surface of said wafer and (ii) directionally sputter said first material from said second target through said plasma and onto said surface with a velocity sufficient to drive at least a first portion of said metal on said surface into said wafer.

2. The apparatus according to claim 1, wherein said metal comprises cobalt.

3. The apparatus according to claim 2, wherein said first material comprises at least one of titanium and titanium nitride.

4. The apparatus according to claim 1, wherein said wafer comprises a second material selected from a group consisting of silicon, gallium arsenide, germanium, gallium nitride, aluminum phosphide, diamond, $Si_{1-x}Ge_x$, and $Al_xGa_{1-x}As$, where $0 \leq x \leq 1$.

5. An apparatus comprising:

means for positioning a wafer adjacent a plasma;

means for sputtering a metal onto a surface of said wafer; and means for directionally sputtering a first material through said plasma and onto said surface with a velocity sufficient to drive at least a first portion of said metal on said surface into said wafer.

6. The apparatus according to claim 5, wherein (i) said metal layer comprises cobalt and (ii) said first material comprises at least one of titanium and titanium nitride.

7. A method of processing a wafer comprising the steps of:

(A) positioning said wafer adjacent a plasma;

(B) sputtering a metal onto a surface of said wafer; and (C) directionally sputtering a first material through said plasma and onto said surface with a velocity sufficient to drive at least a first portion of said metal on said surface into said wafer.

8. The method according to claim 7, further comprising the step of:

heating said wafer to react said first portion of said metal with said wafer.

9. The method according to claim 8, wherein said heating is in response to incidental energy generated via said directional sputtering of said first material.

10. The method according to claim 7, wherein a second portion of said metal mix with said wafer to form a salicide in response to kinetic energy transferred from said metal to said wafer.

11. The method according to claim 10, wherein a temperature of said surface prior to transfer of said kinetic energy is insufficient to generate a reaction between said metal and said wafer.

12. The method according to claim 7, wherein said metal comprises cobalt.

13. The method according to claim 12, wherein said first material comprises at least one of titanium and titanium nitride.

14. The method according to claim 7, wherein step (B) further comprises the sub-steps of:

positively ionizing said metal in said plasma;

generating a negative electrical potential across said wafer; and accelerating said metal in said plasma towards said surface in response to said negative electrical potential.

15. The method according to claim 7, wherein said metal is sputtered at a system temperature in a range of from 400° C. to 500° C.

16. The method according to claim 7, wherein said first material is sputtered at a system temperature in a range of from 400° C. to 500° C.

17. The method according to claim 7, further comprising the step of:

heating said wafer to a temperature in a range of from 700° C. to 1000° C.

18. The method according to claim 17, further comprising the step of:

stripping an unreacted portion of said metal from said surface prior to said heating.

19. The method according to claim 7, wherein said wafer comprises a second material selected from a group consisting of silicon, gallium arsenide, germanium, gallium nitride, aluminum phosphide, diamond, $Si_{1-x}Ge_x$, and $Al_xGa_{1-x}As$, where $0 \leq x \leq 1$.

20. The method according to claim 7, wherein step (B) comprises the sub-step of:

accelerating said metal to a velocity sufficient to drive a second portion of said metal into said wafer.

* * * * *